United States Patent
Duan et al.

(10) Patent No.: US 7,401,315 B2
(45) Date of Patent: Jul. 15, 2008

(54) SYSTEM AND METHOD FOR IMPLEMENTING PACKAGE LEVEL IP PREVERIFICATION FOR SYSTEM ON CHIP DEVICES

(75) Inventors: Haoran Duan, Corvallis, OR (US); Charles Evans, Corvallis, OR (US); Michael Alvin Rencher, Corvallis, OR (US); James R. Emmert, Corvallis, OR (US)

(73) Assignee: Avago Technologies General IP Pte Ltd, Singapore (SG)

( * ) Notice: Subject to any disclaimer, the term of this patent is extended or adjusted under 35 U.S.C. 154(b) by 78 days.

(21) Appl. No.: 11/274,572

(22) Filed: Nov. 14, 2005

(65) Prior Publication Data

US 2007/0113215 A1    May 17, 2007

(51) Int. Cl.
*G06F 17/50* (2006.01)
*H03K 17/693* (2006.01)

(52) U.S. Cl. ..................................................... 716/16
(58) Field of Classification Search ................. 716/4–5, 716/16
See application file for complete search history.

(56) References Cited

U.S. PATENT DOCUMENTS

| | | | |
|---|---|---|---|
| 6,161,215 A * | 12/2000 | Hollenbeck et al. ............ 716/15 |
| 6,240,543 B1 | 5/2001 | Bhandari |
| 6,603,329 B1 * | 8/2003 | Wang et al. ..................... 326/30 |
| 6,917,998 B1 | 7/2005 | Giles |
| 7,076,405 B1 * | 7/2006 | Uchino ............................ 703/2 |
| 7,082,585 B2 * | 7/2006 | Gasparik et al. ................ 716/4 |
| 2002/0149034 A1 * | 10/2002 | Sakiyama et al. ............ 257/200 |
| 2002/0152456 A1 | 10/2002 | Nightingale et al. |
| 2003/0137327 A1 * | 7/2003 | Moon ........................... 327/112 |
| 2004/0103383 A1 * | 5/2004 | Tripathi et al. .................. 716/8 |
| 2004/0237054 A1 | 11/2004 | Tsai et al. |
| 2005/0193353 A1 * | 9/2005 | Malekkhosravi et al. ........ 716/1 |
| 2005/0247999 A1 * | 11/2005 | Nishikawa et al. ........... 257/531 |
| 2006/0022769 A1 * | 2/2006 | Takasu ......................... 333/161 |
| 2006/0034377 A1 * | 2/2006 | Chan ............................ 375/257 |
| 2006/0077601 A1 * | 4/2006 | Ikeda et al. ..................... 361/56 |
| 2006/0077744 A1 * | 4/2006 | Song ............................ 365/226 |
| 2006/0136857 A1 * | 6/2006 | Felton ........................... 716/15 |
| 2006/0154694 A1 * | 7/2006 | Kim .............................. 455/557 |
| 2006/0187596 A1 * | 8/2006 | Cain et al. ....................... 361/56 |
| 2006/0267133 A1 * | 11/2006 | Banerjee et al. .............. 257/509 |

* cited by examiner

*Primary Examiner*—Jack Chiang
*Assistant Examiner*—Suresh Memula

(57) ABSTRACT

A method for implementing package-level intellectual property (PLIP) preverification for system on chip (SOC) devices includes providing at least one externally connected intellectual property (IP) core with an SOC. A package generic unit is provided with the IP core and is configured for providing external interface functions with respect to the SOC, wherein said package generic unit is pre-verified in silicon and independent of the specific packaging of the SOC. A package adaptation unit is provided with the IP core and is configured for providing external interface functions with respect to the SOC, wherein the package adaptation unit is pre-verified in silicon and dependent upon the specific packaging of the SOC.

20 Claims, 4 Drawing Sheets

SYSTEM AND METHOD FOR IMPLEMENTING PACKAGE LEVEL IP PREVERIFICATION FOR SYSTEM ON CHIP DEVICES

BACKGROUND

The present invention is generally within the field of integrated circuit (IC) device design and verification, and, more particularly, defines a new concept: package-level intellectual property (PLIP) embodied by a system and method for implementing the PLIP preverification for system on chip (SOC) devices. The SOC devices are very complex IC's that integrate tens of millions or hundreds of millions of transistors on single silicon chip.

To expedite the development of integrated circuits, chip designers typically combine standard cells from cell libraries. Cells may contain geometrical objects such as, for example, polygons (boundaries), paths, and other cells. Objects in the cell are assigned to "layers" of the design. Cells may be very simple structures that consist of a few transistors, or may be very complex structures that contain thousands or millions of transistors. The cells of the latter type are commonly referred to as "intellectual property" (IP), which represents a higher level of abstraction of a standard cell. Typically, IPs are provided by an IP vendor. As is illustrated by the process flow diagram of FIG. 1, an IP vendor develops and verifies each IP separately (blocks 102, 104), with the expectation that IC layouts that employ the IP will also meet specifications.

Practically speaking, an EP block is only viable if it takes less effort to integrate into an IC than it would to develop the block from scratch. Because IP blocks tend to be used as supplied (with no changes apart from those required by integration), functional verification of the IP block just by itself is less important, and has already been done during its development. Rather, the verification should be designed to show that the rest of the system correctly supports the IP block, and that its presence does not upset the other parts of the design.

Accordingly, an IC designer selects the cells or IPs it wishes to use in an IC layout to provide whatever structures or functionalities are required for a particular application. Each cell has one or more connectivity targets, which are predetermined points used to connect the patterns in a pair of cells. After the verification of the functional design of the cell selections in block 106 (e.g., synthesis by Register Transfer Level (RTL) simulations and translation of the RTL models to a SPICE (Simulation Program with Integrated Circuit Emphasis) netlist), the layout is submitted to a routing program (blocks 108, 110), which connects the target-containing patterns of the adjacent cells to form complete sets of patterns for each mask layer. When a design incorporates two cells adjacent to each other in an IC layout, the router identifies the location of the connectivity target in each cell, and constructs a connecting path between the targets, comprising one or more line segments. This connecting path is incorporated into the IC layout (block 112), so that the mask constructed from the connected cells includes continuous circuit paths.

Subsequently, the IC layout is submitted for artwork verification at block 114 (for example, using a program such as Calibre, by Mentor Graphics of Wilsonville, Oreg.). In the artwork verification process, compliance with design rules is checked. For example, the line spacing between each pair of adjacent lines is compared to the relevant minimum for that line. If the line spacing is less than the minimum required for the width of the merged line, a design rule violation is identified. Finally, cell-based IC design focuses on the package design and verification for the chip die (mechanical and electrical) as shown in block 116, 118.

More recently, complex SOC designs include existing, preverified IP libraries, as well as newly designed components. Depending upon the role of the IP in the SOC, certain IPs may be completely embedded inside the chip itself (i.e., no external connections to/from the die) while certain other fPs are used solely for communication of the signals of the SOC to the outside world. In the latter case, this type of IP continues to be operated at higher and higher signal rates (e.g., sub-gigabit per second to tens of gigabits per second). As such, the implementation and integration of this type of IP into an SOC presents significant challenges. Unfortunately, the two general types of existing implementable IPs (i.e., soft IP cores and hard IP cores) provide only a partial solution for IP integration and validation of complex SOCs, in terms of functionality, time to market, and profit. For example, conventional soft IP blocks are only validated up through the synthesizable RTL stage (blocks 102-104), while conventional hard IP blocks are only validated up through the GDS (Graphic Design Solutions) artwork stage (blocks 102-114).

Accordingly, it would be desirable to be able to provide an IP product that overcomes the existing integration and validation problems associated with present day SOC designs, such as (for example) those including mixed signal IPs therein.

SUMMARY

A system for implementing package-level intellectual property (PLIP) preverification for system on chip (SOC) devices is presented. In an exemplary embodiment, the system includes at least one intellectual property (IP) core formed on an integrated circuit die, the at least one IP core having external connections with respect to the die. A package generic unit is included within the at least one IP core, the package generic unit configured for providing external interface functions with respect to the SOC, wherein the package generic unit is pre-verified in silicon and independent of the specific packaging of the SOC. A package adaptation unit is included with the at least one IP core, the package adaptation unit configured for providing external interface functions with respect to the SOC, wherein said package adaptation unit is pre-verified in silicon and dependent upon the specific packaging of the SOC.

In another embodiment, a method for generating preverified, package-level intellectual property (PLIP) for system on chip (SOC) devices is presented. The method includes defining at least one intellectual property (IP) core to be included in an SOC formed on an integrated circuit die, the at least one IP core having external connections with respect to the die. A package generic unit is defined with the at least one IP core, the package generic unit configured for providing external interface functions with respect to the SOC, wherein said package generic unit is pre-verified in silicon and independent of the specific packaging of the SOC. A package adaptation unit is defined with the at least one IP core, the package adaptation unit configured for providing external interface functions with respect to the SOC, wherein the package adaptation unit is pre-verified in silicon and dependent upon the specific packaging of the SOC.

BRIEF DESCRIPTION OF THE DRAWINGS

Referring to the exemplary drawings wherein like elements are numbered alike in the several Figures.

DETAILED DESCRIPTION

Disclosed herein is a method and system for implementing package level intellectual property (IP) preverification for system on chip (SOC) devices. In an exemplary embodiment, a new class of IP product is defined, and may be referred to hereinafter as a package level EP (PLIP). Under this approach, an IP block is provided and verified at the package level. That is, in addition to the testing and verification provided with conventional soft or hard EP blocks, the PLEP is also provided with (for example), functional and timing verification, completed in design and confirmed in silicon, verification of production reliability (e.g., electrostatic discharge (ESD), latchup, etc.), and verification that bonding wire impact is properly compensated for, tested and characterized in real silicon. Because the PLEP has been pre-validated up to a package level before a user (e.g., SOC designer) acquires the same, a complete solution is provided by the EP vendor.

Structurally, the PLEP includes two main units: a package generic unit and a package adaptation unit. The package generic unit is independent of what specific package the chip is incorporated into. The package adaptation unit is, on the other hand, package dependent and also must be pre-verified in silicon. Further, the package adaptation unit is meant to address issues such signal integrity, ESD, load compensation, impedance matching, and mechanical adaptation. In one embodiment, the package adaptation unit may be implemented in such forms as a pure mechanical adaptor, input/output (I/O) pads with matching bonding wire, or additional silicon fabrication mask layers, depending on the specific nature of the fP and the package characteristics.

Figure 2:
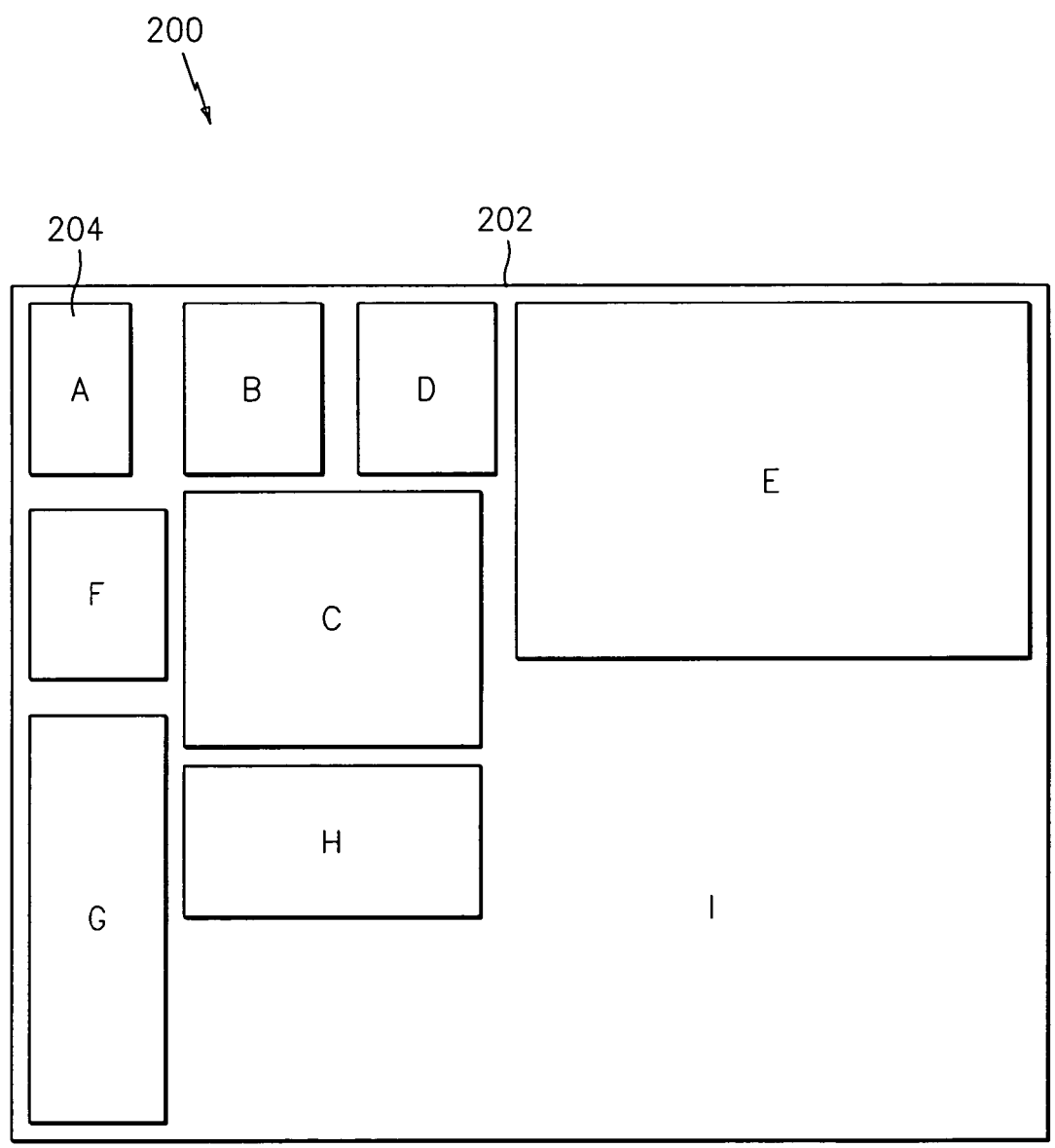
FIG. 2 is a schematic block diagram of an exemplary SOC having one or more vendor supplied IP cores, in addition to the customized chip logic.

Referring now to FIG. 2, there is shown a schematic block diagram of an exemplary system on chip (SOC) 200 having one or more vendor supplied EP cores 204, in addition to the customized chip logic. As is shown, the SOC is formed within an integrated circuit die 202, the area of which is divided into subregions designated A through I in FIG. 2. In particular, regions A through H represent vendor supplied IP cores 204 (e.g., soft IP cores, hard IP cores), while region I contains the customized chip logic specific to the SOC 200. Certain IP cores may be configured so as to have no external connections with respect to the die 202, while certain other fP cores may have external connections with respect to the die 202. In the example illustrated, a first group of IP cores (e.g., A, B, D, E, F, and G) include external connections while a second group of IP cores (e.g., C, H) does not.

Figure 1:
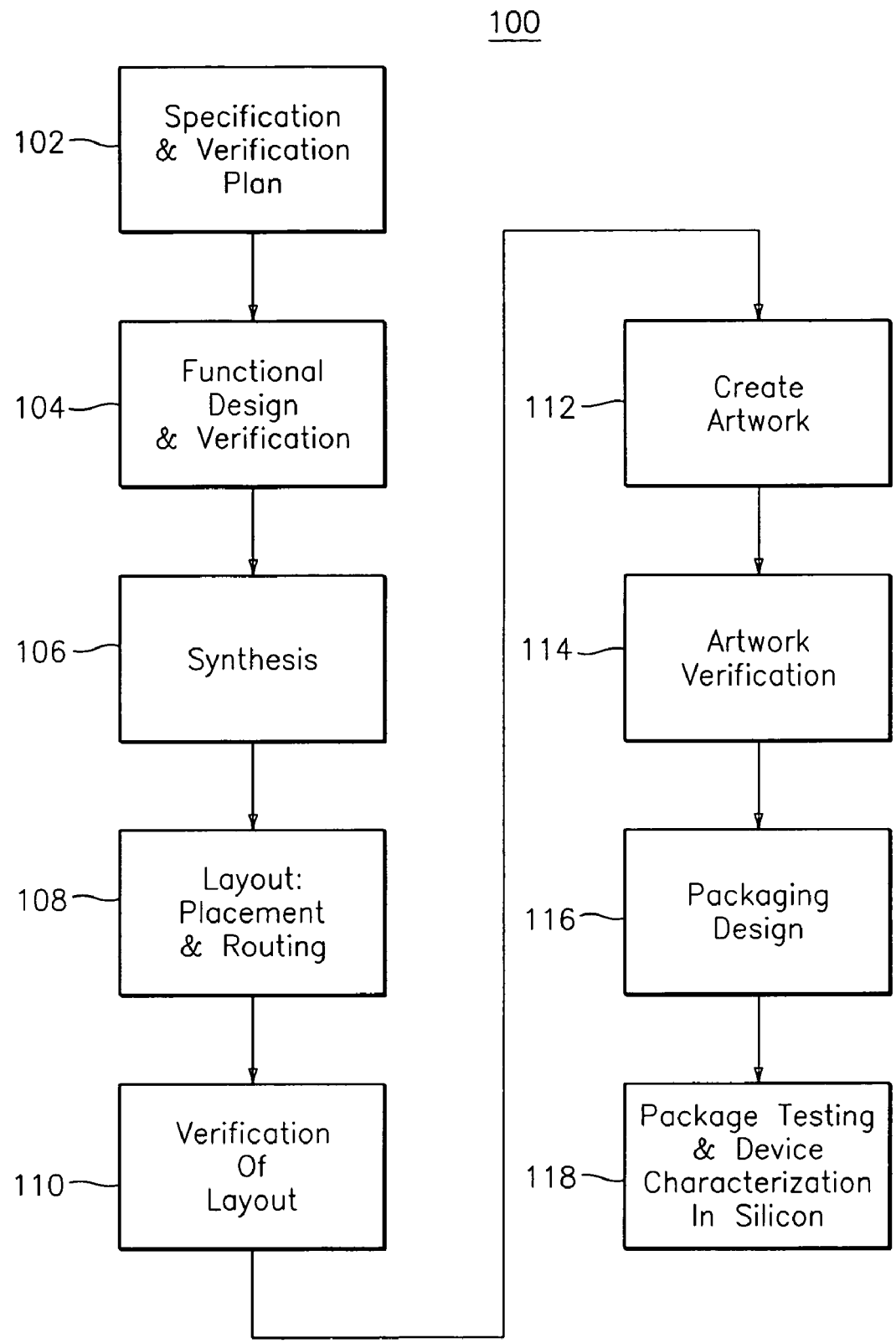
FIG. 1 is a schematic block diagram of an SOC design and verification process.
Figure 3:
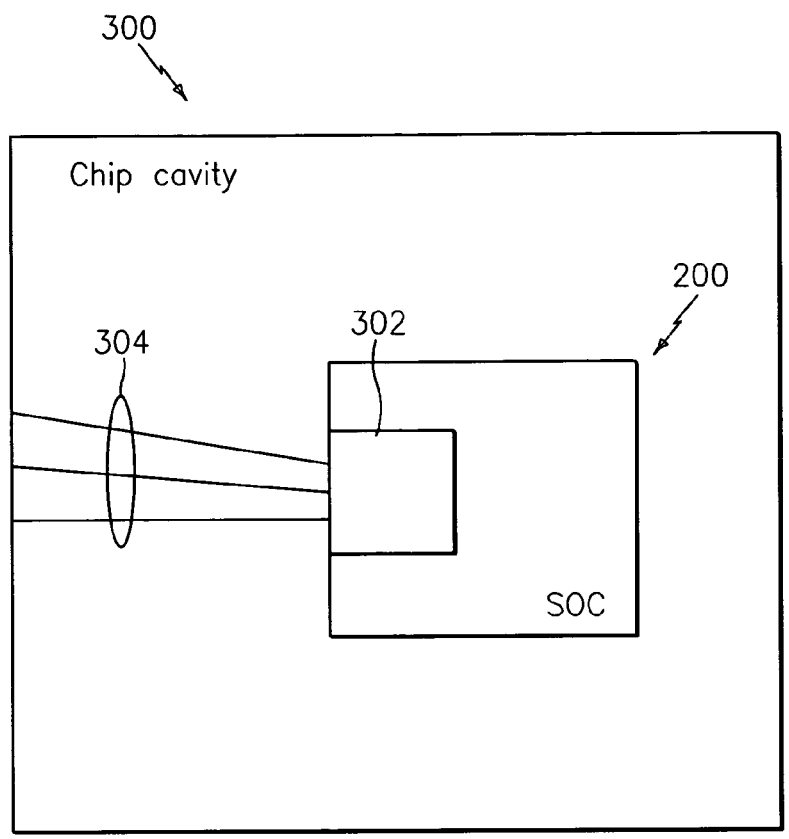
FIG. 3 is a schematic block diagram of the SOC as provided within a semiconductor package.

FIG. 3 is another schematic block diagram of the SOC 200 as provided within a semiconductor package 300. Region 302 depicted within the SOC 200 represents one or more of the first group of IP cores having external connections with respect to the chip. Such connections, generally depicted by 304, can include (for example) bond wires that are connected between pads on the die 202 and corresponding conductors provided in the package 300. For an SOC that is packaged in the manner as depicted in FIG. 3, an IC provider conventionally assumes the burdens of integrating and verifying, and fine-tuning the design of the IPs into the silicon of the die 202 and the packaging 300, particularly where such IPs represent high-speed connectivity IPs of a mixed signal design. In other words, the chip designer/manufacturer and not the individual IP provider conventionally implements the steps shown in blocks 116 and 118 of FIG. 1.

Figure 4:
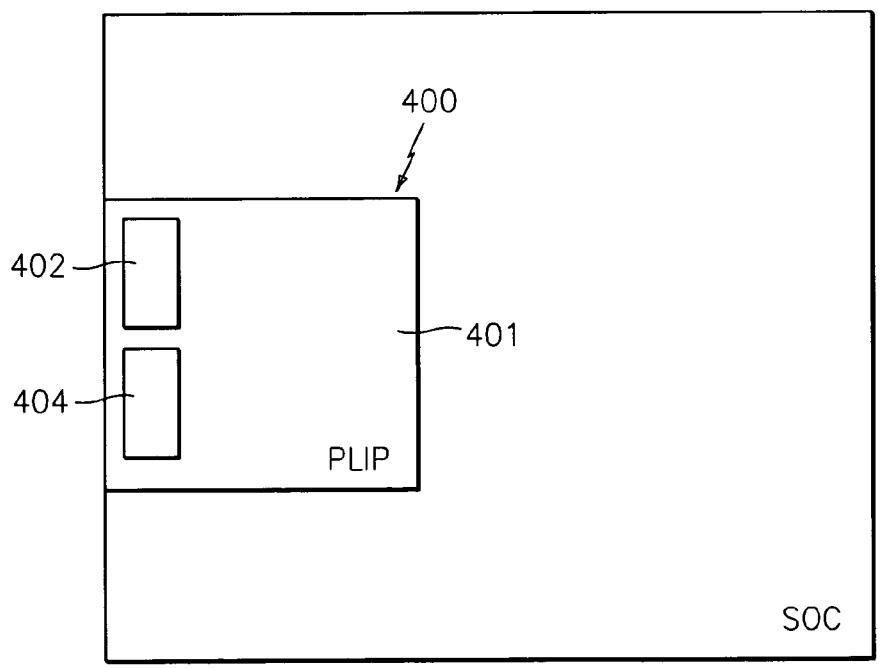
FIG. 4 is a schematic block diagram of a novel method and structure of an IP core that is pre-verified at a package level, in accordance with an embodiment of the invention.

Accordingly, FIG. 4 illustrates a schematic block diagram of a novel method and structure of an IP core 400 that is pre-verified at a package level. In addition to the functional logic elements of the IP core itself (generally depicted at 401), the PLIP 400 further includes a package generic unit 402 and a package adaptation unit 404. In one sense, the functional "IP specific" logic portion 401 of the IP core 400 is somewhat similar to a conventional IP in hardmacro form, except that the functional logic 401 must be pre-verified in silicon together along with the package generic unit 402 and package adaptation unit 404. More specifically, FIGS. 5 and 6 further illustrate the various major functional components of each respective unit.

Figure 5:
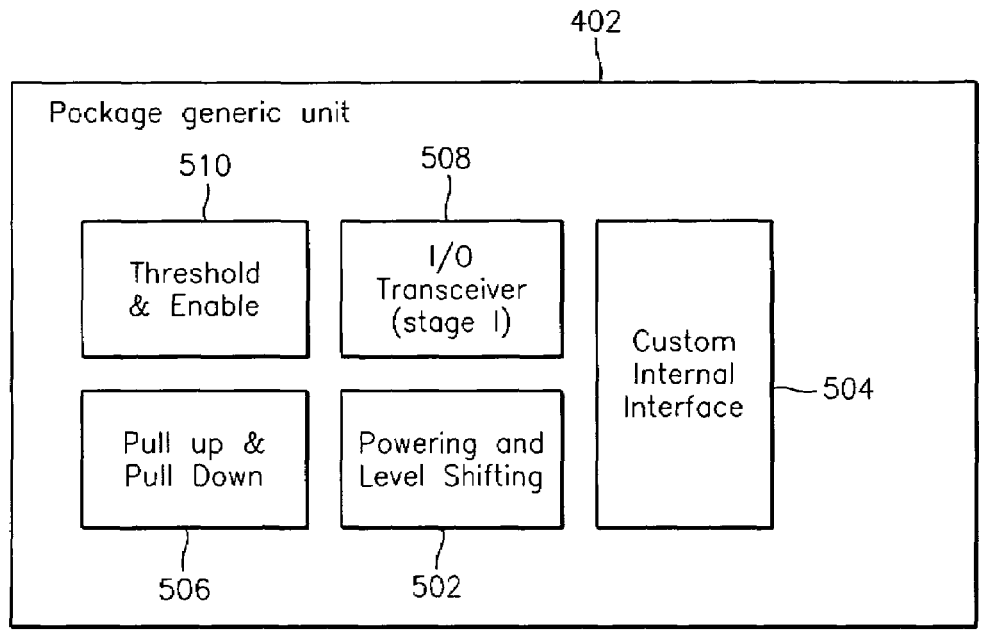
FIG. 5 is a more detailed block diagram of the package generic unit included in the pre-verified IP core of FIG. 4.

In particular, the package generic unit (PGU) 402 shown in FIG. 5 handles all functional electrical aspects of the IP. In an exemplary embodiment, the PGU 402 includes several major sub-blocks. First, a "Powering and Level Shifting" sub-block 502 is configured to convert the I/O signal voltage level to the proper range as defined by industry standards (since SOC internal signal voltages are typically much lower than those of I/O levels). Sub-block 502 also provides various package independent functions related to internal power distribution of the PLIP within an SOC.

A "Custom Internal Interface" sub-block 504 is provided for separating the SOC internal control signals and the I/O signals. In addition, a "Pull up & Pull down" sub-block 506 adjusts the line voltage to a proper level when there is no real data currently being transmitted or received. An "I/O Transceiver (stage I)" sub-block 508 represents the package independent stage of the I/O transceiver included in the IP, and a "Threshold & Enable" sub-block 510 generates control signals used by other sub-blocks of the PGU 402, such as the "I/O Transceiver (stage I)" sub-block 508 and the "Pull up & Pull down" sub-block 506.

Figure 6:
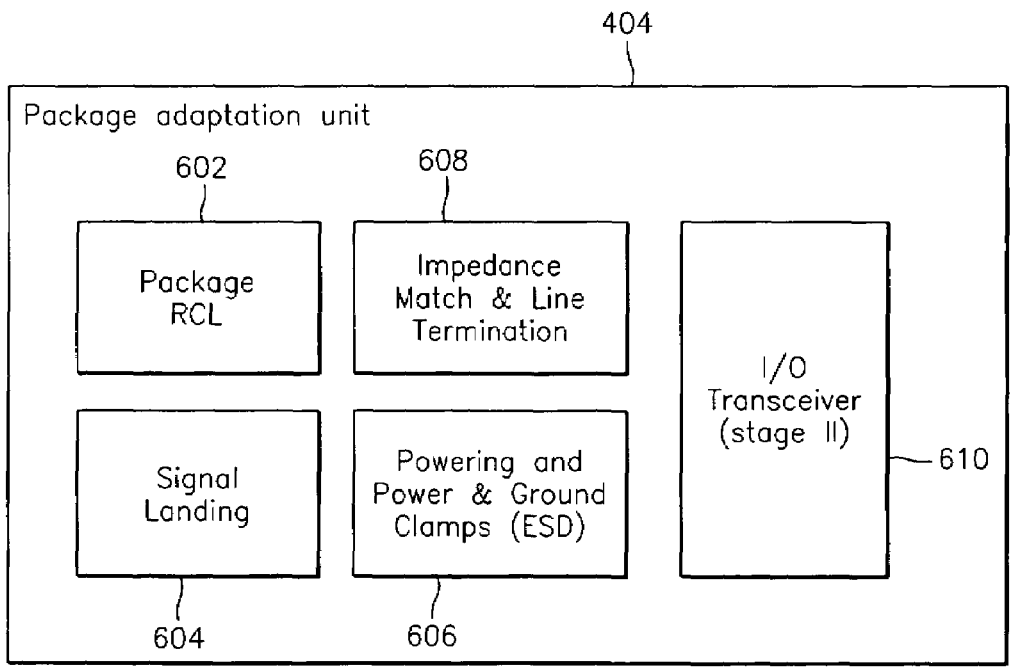
FIG. 6 is a more detailed block diagram of the package adaptation unit included in the pre-verified IP core of FIG. 4.

Referring to FIG. 6, the package adaptation unit (PAU) 404 handles the package related aspects (electrical and mechanical) of the IP. The PAU 404 also has a plurality of major sub-blocks including, for example a "Package RCL" sub-block 602 configured for modeling parameters such as resistance, capacitance, and inductance along a trace from a package pin to a pin on the SOC die. The RCL value and associated network are unique to the package that a particular SOC uses. A "Signal Landing" sub-block 604 is a mechanical sub-block in which signals physically connected to/from the die are routed therethrough. This may be embodied, for example, by a flat metal area on the die for soldering a wire (wire bond package), or it may be a few mask layers for re-distributing signal pins on the top of the die in such way that the pins are mechanically aligned to pins on the package.

In addition, a "Powering and Power & Ground Clamps" sub-block 606 is configured for electrostatic discharge protection of the SOC, as well as for package dependent aspects of power distribution to the PLIP inside an SOC (e.g., routing of power lines from a chip package, power landing contacts on the SOC, etc.). An "Impedance Match & Line Termination" sub-block 608 minimizes signal reflection for both directions, and an "I/O Transceiver (stage II)" sub-block 610 represents the package dependent stage of the I/O transceiver.

As will thus be appreciated, by providing IP that is pre-verified at a package level, the level of functional abstraction is raised, thus greatly simplifying the integration effort of IP to an SOC, and minimizing integration risk associated therewith. This in turn reduces the time-to-market, as well as enhances the chip success rate. By definition of a PLIP, high-speed connectivity IPs (e.g., a mixed signal design) are required to be silicon pre-verified in the same chip package in which the IP will be used. Thus, where the IP is already supplied with the package level verification, the dependency of the SOC and IP fine-tuning on the silicon and packaging processes is eliminated.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system on chip (SOC) having pre-verified, package-level intellectual property (PLIP), the system comprising:
   at least one intellectual property (IP) core formed on an integrated circuit die, said at least one IP core having external connections with respect to said die;
   a package generic unit included within said at least one IP core, said package generic unit configured for providing external interface functions with respect to the SOC, wherein said package generic unit is pre-verified in silicon and independent of the specific packaging of the SOC, the package generic unit comprising a powering and level shifting sub-block configured to handle package independent power distribution and to convert voltages from an internal level used within said SOC to an input/output (I/O) signal level, and a custom internal interface sub-block configured to separate SOC control signals and I/O signals; and
   a package adaptation unit included with said at least one IP core, said package adaptation unit configured for providing external interface functions with respect to said SOC, wherein said package adaptation unit is pre-verified in silicon and dependent upon the specific packaging of said SOC.

2. The system of claim 1, wherein said package generic unit further comprises a powering and level shifting sub-block configured to convert voltages from an internal level used within said SOC to an input/output (I/O) signal level, said powering and level shifting sub-block further configured to provide package independent functions related to internal power distribution within said SOC.

3. The system of claim 1, wherein said package generic unit further comprises a custom internal interface sub-block configured to separate SOC control signals and input/output (I/O) signals.

4. The system of claim 1, wherein said package generic unit further comprises a sub-block configured to adjust a transmission line voltage to a fixed level in the absence of data transmitted or received thereon.

5. The system of claim 1, wherein said package generic unit further comprises a first stage input/output (I/O) transceiver sub-block, and wherein said package adaptation unit further comprises a second stage input/output (I/O) transceiver sub-block.

6. The system of claim 1, wherein said package adaptation unit further comprises a package RCL sub-block configured for modeling resistance, capacitance and inductance values along a trace from a package pin to a pin on said SOC.

7. The system of claim 1, wherein said package adaptation unit further comprises a signal landing sub-block configured for physically connecting signals between the specific packaging of said SOC and said SOC.

8. The system of claim 1, wherein said package adaptation unit further comprises a powering and power/ground clamp sub-block configured for electrostatic discharge protection of said SOC, said powering and power/ground clamp sub-block further configured to provide package dependent functions related to power distribution within said SOC.

9. The system of claim 1, wherein said package adaptation unit further comprises an impedance matching and line termination sub-block configured for minimizing signal reflection in both input and output directions.

10. A system on chip (SOC) having pre-verified, package-level intellectual property (PLIP), the system comprising:
    at least one intellectual property (IP) core formed on an integrated circuit die, said at least one IP core having external connections with respect to said die;
    a package generic unit included within said at least one IP core, said package generic unit configured for providing external interface functions with respect to the SOC, wherein said package generic unit is pre-verified in silicon and independent of the specific packaging of the SOC; and
    a package adaptation unit included with said at least one IP core, said package adaptation unit configured for providing external interface functions with respect to said SOC, wherein said package adaptation unit is pre-verified in silicon and dependent upon the specific packaging of said SOC, wherein said package generic unit further comprises:
    a powering and level shifting sub-block configured to handle package independent power distribution and to convert voltages from an internal level used within said SOC to an input/output (I/O) signal level;
    a custom internal interface sub-block configured to separate SOC control signals and I/O signals;
    a pull-up/pull-down sub-block configured to adjust a transmission line voltage to a fixed level in the absence of data transmitted or received thereon;
    a first stage input/output (I/O) transceiver sub-block; and
    a threshold and enable sub-block configured to generate control signals used by said level shifting sub-block, said custom internal interface sub-block, said pull-up/pull-down sub-block and said first stage I/O transceiver sub-block.

11. A method for generating pre-verified, package-level intellectual property (PLIP) for system on chip (SOC) devices, the method comprising:
    defining at least one intellectual property (IP) core to be included in an SOC formed on an integrated circuit die, said at least one IP core having external connections with respect to said die;
    defining a package generic unit with said at least one IP core, said package generic unit configured for providing external interface functions with respect to said SOC, wherein said package generic unit is pre-verified in silicon and independent of the specific packaging of said SOC, the package generic unit comprising a powering and level shifting sub-block configured to handle package independent power distribution and to convert voltages from an internal level used within said SOC to an input/output (I/O) signal level, and a custom internal interface sub-block configured to separate SOC control signals and I/O signals; and defining a package adaptation unit with said at least one IP core, said package adaptation unit configured for providing external interface functions with respect to said SOC, wherein said package adaptation unit is pre-verified in silicon and dependent upon the specific packaging of said SOC.

12. The method of claim 11, wherein said package generic unit further comprises a powering and level shifting sub-block configured to convert voltages from an internal level used within said SOC to an input/output (I/O) signal level, said powering and level shifting sub-block further configured to provide package independent functions related to internal power distribution within said SOC.

13. The method of claim 11, wherein said package generic unit further comprises a custom internal interface sub-block configured to separate SOC control signals and input/output (I/O) signals.

14. The method of claim 11, wherein said package generic unit further comprises a sub-block configured to adjust a transmission line voltage to a fixed level in the absence of data transmitted or received thereon.

15. The method of claim 11, wherein said package generic unit further comprises a first stage input/output (I/O) transceiver sub-block, and wherein said package adaptation unit further comprises a second stage input/output (I/O) transceiver sub-block.

16. The method of claim 11, wherein said package adaptation unit further comprises a package RCL sub-block configured for modeling resistance, capacitance and inductance values along a trace from a package pin to a pin on said SOC.

17. The method of claim 11, wherein said package adaptation unit further comprises a signal landing sub-block configured for physically connecting signals between the specific packaging of said SOC and said SOC.

18. The method of claim 11, wherein said package adaptation unit further comprises a powering and power/ground clamp sub-block configured for electrostatic discharge protection of said SOC, said powering and power/ground clamp sub-block further configured to provide package dependent functions related to power distribution within said SOC.

19. The method of claim 11, wherein said package adaptation unit further comprises an impedance matching and line termination sub-block configured for minimizing signal reflection in both input and output directions.

20. A method for generating pre-verified, package-level intellectual property (PLIP) for system on chip (SOC) devices, the method comprising:

defining at least one intellectual property (IP) core to be included in an SOC formed on an integrated circuit die, said at least one IP core having external connections with respect to said die;

defining a package generic unit with said at least one IP core, said package generic unit configured for providing external interface functions with respect to said SOC, wherein said package generic unit is pre-verified in silicon and independent of the specific packaging of said SOC; and defining a package adaptation unit with said at least one IP core, said package adaptation unit configured for providing external interface functions with respect to said SOC, wherein said package adaptation unit is pre-verified in silicon and dependent upon the specific packaging of said SOC, wherein said package generic unit further comprises:

a powering and level shifting sub-block configured to handle package independent power distribution and to convert voltages from an internal level used within said SOC to an input/output (I/O) signal level;

a custom internal interface sub-block configured to separate SOC control signals and I/O signals;

a pull-up/pull-down sub-block configured to adjust a transmission line voltage to a fixed level in the absence of data transmitted or received thereon;

a first stage input/output (I/O) transceiver sub-block; and a threshold and enable sub-block configured to generate control signals used by said level shifting sub-block, said custom internal interface sub-block, said pull-up/pull-down sub-block and said first stage I/O transceiver sub-block.

* * * * *